United States Patent
Kitamura et al.

(10) Patent No.: US 8,232,477 B2
(45) Date of Patent: Jul. 31, 2012

(54) CURABLE RESIN COMPOSITION, HALOGEN-FREE RESIN SUBSTRATE, AND HALOGEN-FREE BUILD-UP PRINTED WIRING BOARD

(75) Inventors: Kazunori Kitamura, Saitama (JP); Yukihiro Koga, Saitama (JP); Kiyoshi Sato, Saitama (JP)

(73) Assignee: San-Ei Kagaku Co., Ltd., Tokyo (JP)

( * ) Notice: Subject to any disclaimer, the term of this patent is extended or adjusted under 35 U.S.C. 154(b) by 423 days.

(21) Appl. No.: 12/494,798

(22) Filed: Jun. 30, 2009

(65) Prior Publication Data
US 2010/0006324 A1    Jan. 14, 2010

(30) Foreign Application Priority Data

Jul. 10, 2008  (JP) .................... 2008-204796
Jun. 5, 2009   (JP) .................... 2009-152935

(51) Int. Cl.
  *H05K 1/03*   (2006.01)
  *H01L 23/053* (2006.01)
  *H01L 23/12*  (2006.01)

(52) U.S. Cl. ........ 174/255; 174/262; 174/264; 257/701; 428/209

(58) Field of Classification Search ............ 174/255
See application file for complete search history.

(56) References Cited

U.S. PATENT DOCUMENTS

| | | | |
|---|---|---|---|
| 5,652,042 A * | 7/1997 | Kawakita et al. | 428/209 |
| 6,618,933 B2 * | 9/2003 | Yamamoto et al. | 29/829 |
| 6,680,123 B2 * | 1/2004 | Takeuchi et al. | 428/413 |
| 6,869,665 B2 * | 3/2005 | Tani et al. | 428/209 |
| 7,535,095 B1 * | 5/2009 | En et al. | 257/701 |
| 2003/0137045 A1 * | 7/2003 | Sugaya et al. | 257/701 |
| 2003/0178229 A1 * | 9/2003 | Toyoda et al. | 174/261 |
| 2004/0009335 A1 * | 1/2004 | Kojima et al. | 428/209 |
| 2004/0145044 A1 * | 7/2004 | Sugaya et al. | 257/698 |
| 2005/0005437 A1 * | 1/2005 | Nakamura et al. | 29/846 |
| 2005/0008868 A1 * | 1/2005 | Nakamura et al. | 428/414 |
| 2005/0126818 A1 * | 6/2005 | Kojima et al. | 174/255 |
| 2006/0272853 A1 * | 12/2006 | Muramatsu et al. | 174/262 |

(Continued)

FOREIGN PATENT DOCUMENTS

| | | |
|---|---|---|
| JP | 3739600 | 11/2005 |
| KR | 10-0272850 | 1/2001 |
| WO | 97/16056 | 5/1997 |
| WO | WO 2007/032424 | 3/2007 |

OTHER PUBLICATIONS

Chinese Office Action dated Jun. 22, 2011 in corresponding Chinese Appln. No. 200910140046.2 with English translation of Chinese Office Action. KR Office Action dated May 18, 2011.

*Primary Examiner* — Timothy Thompson
*Assistant Examiner* — Nathan Milakovich
(74) *Attorney, Agent, or Firm* — Young & Thompson (57) ABSTRACT

In a curable resin composition containing an inorganic filler, the average particle diameter of the inorganic filler is 1 μm or less and the content of the inorganic filler is 50 wt % or less. The curable resin composition can be preferably used for a halogen-free resin substrate and the like having a small load on an environment as a hole-plugging curable resin composition as well as used to provide a hole-plugging build-up printed wiring board having a via-on-via structure (in particular, a stacked via structure) having an excellent crack-resistant property, an excellent insulation/connection reliability, and the like.

14 Claims, 3 Drawing Sheets

U.S. PATENT DOCUMENTS

2008/0041615 A1* 2/2008 Zhong et al. .................. 174/255
2008/0078570 A1* 4/2008 Japp et al. ..................... 174/256
2008/0083560 A1* 4/2008 Saiki et al. .................... 174/255
2008/0265438 A1* 10/2008 Asano ........................... 257/778
2009/0020319 A1* 1/2009 Yamada ........................ 174/255
2009/0104429 A1* 4/2009 Goto et al. ................. 428/319.3

* cited by examiner

CURABLE RESIN COMPOSITION, HALOGEN-FREE RESIN SUBSTRATE, AND HALOGEN-FREE BUILD-UP PRINTED WIRING BOARD

BACKGROUND OF THE INVENTION

1. Field of the Invention

The present invention relates to a curable resin composition as well as a hole-plugging core substrate and a hole-plugging printed wiring board. In particular, the present invention relates to a hole-plugging curable resin composition of a halogen-atom-non-containing resin substrate (halogen-free resin substrate), a halogen-free resin substrate filled with the cured product of the composition, and a halogen-free build-up printed wiring board manufactured by the halogen-free resin substrate.

2. Description of the Related Art

A halogen-containing resin substrate such as a brominated epoxy resin substrate and the like may be used to a core substrate in a printed wiring board and the like from the view point of flame resistance.

However, in view of a recent environmental problems (particularly, a problem of dioxine generated in incineration), a halogen-free resin substrate such as an EP (epoxy) resin substrate and the like is more preferable than a halogen-containing resin substrate.

Incidentally, a conventional hole-plugging resin ink is solely designed and composed to reduce a linear expansion coefficient of its cured product to prevent occurrence of a crack of a printed wiring board (Japanese Patent No. 3739600 and the like).

Figure 2:
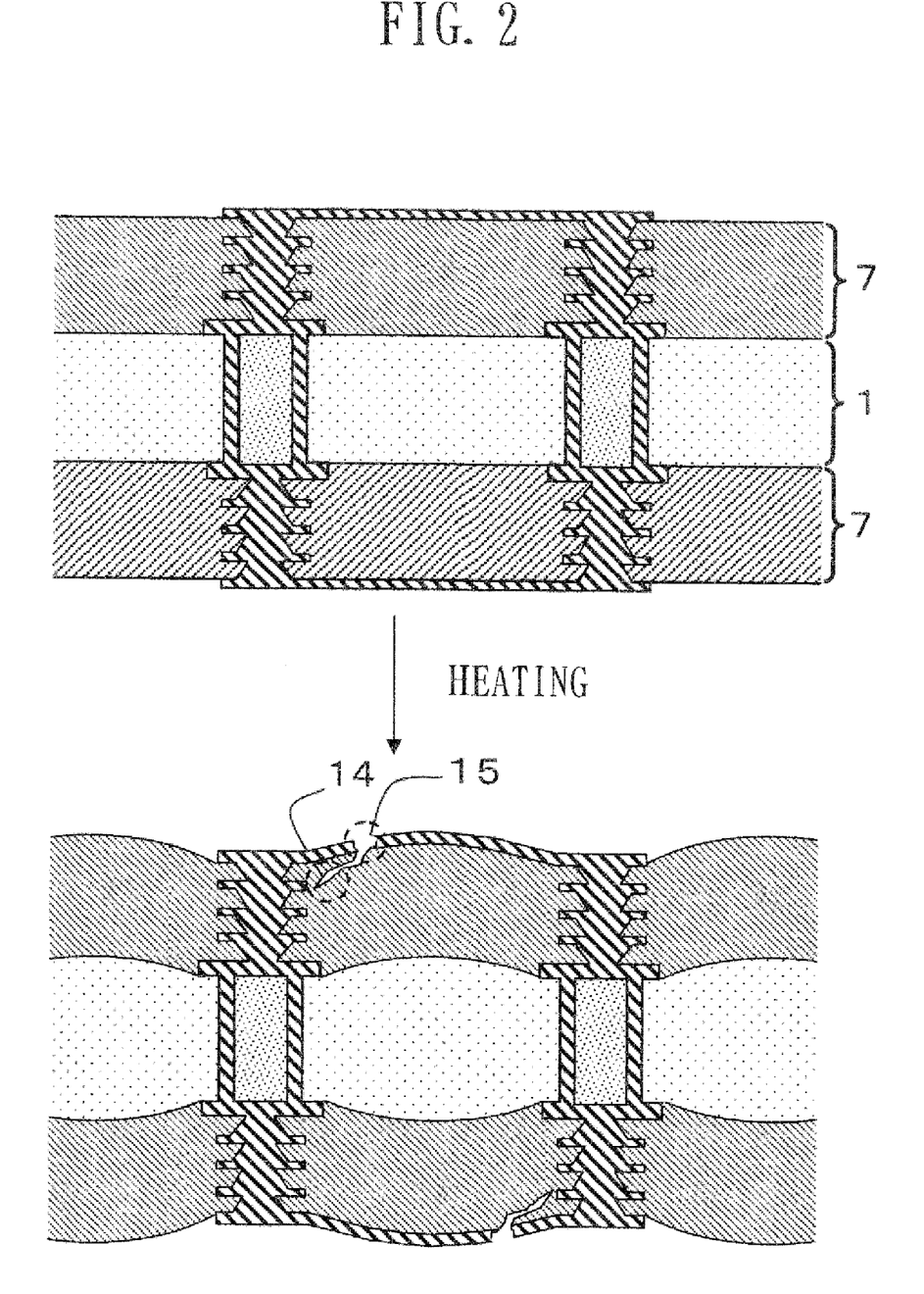
FIG. 2 is a sectional view showing a state that an interlayer insulation material is cracked and a copper foil is cut after the buildup printed wiring board is heated.

However, when the inventors manufactured a build-up printed wiring board having a via-on-via structure (that is, a structure in which a via is overlapped just on a via) by filling the through holes of a halogen-free resin substrate with the conventional resin ink and curing it, it was found that a crack-resistant property and various reliabilities (insulation reliability, connect reliability and the like) were greatly deteriorated when three or more build-up layers were formed (that is, when made to a stacked via structure). Specifically, when the build-up printed wiring board was subjected to a cold/heat cycle test, it was found that a crack of an interlayer insulation material (FIGS. 2, (14)), a cutting of a copper foil (circuit copper foil, through hole plating copper foil, and the like, FIGS. 2, (15)), and the like occurred particularly in the vicinity of an outer layer, in the vicinity of stacked via, and further in the vicinity of through holes, and the like at a relatively small number of times of cold/heat cycles.

In view of the above circumstances, an object of the present invention is to provide a hole-plugging curable resin composition preferably used for a halogen-free resin substrate and the like having a small load on an environment, a core substrate, and a hole-plugging build-up printed wiring board having a via-on-via structure (in particular, a stacked via structure) having an excellent crack-resistant property, an excellent insulation/connection reliability, and the like.

SUMMARY OF THE INVENTION

A result of the diligent examination of the inventors to solve the above problems, the inventors have achieved the following inventions.

That is, a first invention of this application provides a curable resin composition containing an inorganic filler, wherein the average particle diameter of the inorganic filler is 1 μm or less and the content of the inorganic filler is 50 wt % or less.

A second invention of this application provides the curable resin composition of the first invention, wherein the average particle diameter of the inorganic filler is 0.1 μm or less and the content of the inorganic filler is 10 to 50 wt %.

A third invention of this application provides the curable resin composition of the first invention or the second invention, wherein a cured product having an average linear expansion coefficient of 50 ppm/K or more in at least one direction is provided.

A fourth invention of this application provides the curable resin composition of the first invention or the second invention, wherein a cured product having an average linear expansion coefficient of 65 to 100 ppm/K in at least one direction is provided.

A fifth invention of this application provides the curable resin composition of any of the first to fourth invention, wherein the curable resin composition is used to fill a hole of a core substrate.

A sixth invention of this application provides the curable resin composition of the fifth invention, wherein the core substrate is a halogen-free resin substrate.

A seventh invention of this application provides the curable resin composition of the fifth invention or the sixth invention, wherein the core substrate is used to manufacture a build-up printed wiring board.

An eighth invention of this application provides the curable resin composition of the seventh invention, wherein the build-up printed wiring board has a via-on-via structure.

A ninth invention of this application provides the curable resin composition of the seventh invention, wherein the build-up printed wiring board has a stacked via structure.

A tenth invention of this application provides the curable resin composition of any of the fifth to ninth invention, wherein the average linear expansion coefficient of the cured product is larger than the average linear expansion coefficient of the core substrate by 25 ppm/K or more in the Z-axis direction of the core substrate.

An eleventh invention of this application provides the curable resin composition of any of the first to tenth invention, wherein the curable resin composition contains 40 to 80 wt % of curable resin and 1 to 10 wt % of a curing agent.

A twelfth invention of this application provides the curable resin composition of any of the first to eleventh invention, wherein the curable resin is epoxy resin.

A thirteenth invention of this application provides a core substrate, wherein at least one hole portion is filled with the cured product of the curable resin composition of any of the first to twelfth invention.

A fourteenth invention of this application provides the core substrate of the thirteenth invention, wherein the core substrate is a halogen-free resin substrate.

A fifteenth invention of this application provides the core substrate of the thirteenth invention or the fourteenth invention, wherein the core substrate is used to manufacture a build-up printed wiring board.

A sixteenth invention of this application provides the core substrate of the fifteenth invention, wherein the build-up printed wiring board has a via-on-via structure.

A seventeenth invention of this application provides the core substrate of the fifteenth invention, wherein the build-up printed wiring board has a stacked via structure.

An eighteenth invention of this application provides a printed wiring board having the core substrate of any of the thirteenth to seventeenth invention.

A nineteenth invention of this application provides the printed wiring board of the eighteenth invention, wherein the printed wiring board is a build-up printed wiring board.

A twentieth invention of this application provides the printed wiring board of the nineteenth invention, wherein the build-up printed wiring board has a via-on-via structure.

A twenty-first invention of this application provides the printed wiring board of the nineteenth invention, wherein the build-up printed wiring board has a stacked via structure.

The present invention provides the hole-plugging curable resin composition preferably used for a halogen-free resin substrate and the like having a small load on an environment as well as a hole-plugging build-up printed wiring board and the like having a via-on-via structure (in particular, a stacked via structure) having an excellent crack-resistant property, an excellent insulation/connection reliability, and the like.

DESCRIPTION OF THE PREFERRED EMBODIMENTS

The present invention will be described below in detail based on a preferred embodiment.

A curable resin composition of the present invention includes an inorganic filler. The inorganic filler has a function for adjusting the coefficient of thermal expansion of a cured product. Specifically exemplified as the inorganic filler are barium compounds [barium sulfate, barium titanate and the like], silicas [silicone powder, silicon oxide powder, amorphous silica, fused silica, indefinite silica, crystal silica and the like], calcium compounds [calcium carbonate, calcium silicate, and the like], magnesium compounds [magnesium carbonate, magnesium hydroxide, and the like], zinc compounds [zinc hydroxide, zinc borate, zinc molybdate, and the like], zirconium compounds [zirconium silicate, zirconium oxide, and the like], aluminum hydroxide, potassium titanate, oxides [titanium oxide, zinc oxide, aluminum oxide (alumina), magnesium oxide, beryllium oxide, and the like], nitrides [aluminum nitride, silicon nitride, boron nitride, and the like], carbides [silicon carbide and the like], metals [copper, silver, solder, and the like], diamond, clay, talc, mica, beryllia, zirconia, zircon, forsterite, steatite, spinel, mullite, titania and the like, and one or more kinds of them can be blended. The inorganic filler is preferably barium sulfate, amorphous silica, titanium oxide, zinc oxide, aluminum oxide, calcium carbonate, and the like.

The average particle diameter (μm) of the inorganic filler is 1 or less, preferably 0.1 or less, and most preferably 0.01 to 0.1.

The content (weight %) of the inorganic filler is 50 or less, preferably 10 to 50, and most preferably 25 to 45.

When the average particle diameter or the content of the inorganic filler are excessively large, since the average linear expansion coefficient of a cured product is made excessively small, a preferable average linear expansion coefficient to be described later cannot be obtained. As a result, the effect of the present invention may not be sufficiently achieved. Accordingly, in the curable resin composition of the present invention, it is referable to adjust and select the average particle diameter and the content of the inorganic filler so that the coefficient of thermal expansion of the cured product is made to the preferable one to be described later.

Exemplified as the curable resin composition of the present invention are a thermosetting resin composition, a photosetting resin composition, a thermo-thermo (heat-heat) two-stage setting resin composition, a photo/thermo (light/heat) two-stage setting resin composition, and the like.

Further, exemplified as a curing type of the curable resin composition of the present invention are an anionic polymerization, cationic polymerizations (including a heat cationic polymerization, a light cationic polymerization), a heat radical polymerization, a light radical polymerization, and combinations of at least two of them (a multistage polymerization) and the like.

Exemplified as the curable resin in the curable resin composition of the present invention are, for example, epoxy resin, oxetane resin, phenol resin, amino resin, unsaturated polyester resin, diallyl phthalate resin, acrylate resin, urethane resin, thermo-thermo (heat-heat) two-stage setting resin, and photo/thermo (light/heat) two-stage setting resin and the like, and at least one kind of them may be used. The curable resin is preferably an epoxy resin.

Specifically exemplified as the epoxy resin is bisphenol epoxy resin (A type, AD type, F type, S type and the like), novolac epoxy resin, cresol novolac epoxy resin, phenol novolac epoxy resin, polyhydric phenol glycidyl ether, alicyclic epoxy resin, biphenyl epoxy resin, diphenyl ether epoxy resin, dicyclopentadiene epoxy resin, fluorene epoxy resin, naphthalene epoxy resin, glycidyl amine epoxy resin, glycidyl ester epoxy resin and the like, and at least one kind of them may be used.

The epoxy resin may be in any of a liquid state and a solid state at a room temperature, solid epoxy resin, which is previously dissolved with a dissolving agent such as epoxy monomer and the like, is preferable. Specifically exemplified as the epoxy monomer are monofunctional epoxy compounds [n-butyl glycidyl ether, phenyl glycidyl ether, and the like], polyhydric alcohol diglycidyl ethers [butanediol diglycidyl ether and the like], triglycidyl ethers [trimethylolpropane triglycidyl ether, N,N,O-tris glycidyl-p-aminophenol and the like], and at least one kind of them may be used.

Exemplified as the oxetane resin are, for example, 3-ethyl-3-hydroxymethyl oxetane, 1,4-vis-[(3-ethyl-3-oxetanyl)methoxy]methyl}benzene, 3-ethyl 3-(phenoxymethyl)oxetane, di[1-ethyl(3-oxetanyl)]methyl ether, 3-ethyl-3-(2-ethyl hexyloxymethyl)oxetane, 3-ethyl-3-[3-(triethoxy)propoxy]methyl}oxetane, and oxetanyl-silsesquioxane and the like, and at least one kind of them may be used.

Exemplified as the phenol resin is resin additionally condensation-reacted with phenols and aldehydes. Exemplified as the phenols are, for example, phenol, cresol, xylenol, nonylphenol, octylphenol and the like. Exemplified as the aldehydes are, for example, formaldehyde, acetaldehyde and the like. Specifically exemplified as the phenol resin are, for example, phenol novolak resin, cresol novolak resin, triphenol methane resin, terpene denatured phenol resin, dicyclopentadiene denatured phenol resin, phenol aralkyl resin (including a phenylene scaffold), naphthol aralkyl resin and the like, and at least one kind of them may be used.

Exemplified as the amino resin are resin obtained by condensation polymerizing aminos with aldehydes, and the like. Exemplified as the aminos are, for example, melamine, urea, benzoguanamine, acetoguanamine, steroguanamine, spiroguanamine, dicyan diamide, and the like. Exemplified as the aldehydes are, for example, formaldehyde, acetaldehyde and the like, and at least one kind of them may be used.

Exemplified as the unsaturated polyester resin are resin obtained by dehydration-condensation reacting dicarboxylic acid with diol, and the like. Exemplified as the dicarboxylic acid are, for example, terephthalic acid, 2,6-naphthalenedicarboxylic acid, and the like. Exemplified as the diol are, for example, ethylene glycol, 1,3-propanediol, 1,4-butanediol, 1,4-cyclohexane dimethanol and the like. Specifically exemplified as the unsaturated polyester resin are, for example, polyethylene terephthalate, polytrimethylene terephthalate, polybutylene terephthalate, polyethylene naphthalate, polybutylene naphthalate, and the like, and at least one kind of them may be used.

Exemplified as the diallyl phthalate resin are, for example, diallyl orthophthalate monomer synthesized from phthalic anhydride or isophthalic acid and allyl chloride and the like, diallyl isophthalate monomer, diallyl terephthalate monomer, prepolymer with which about 10 to 30 of these monomers are polymerized, and the like, and at least one kind of them may be used.

Exemplified as the acrylate resin are, for example, resin obtained by dehydration-condensation reacting epoxy resin with acryl acid, copolymer of acrylates and glycidyl acrylate, and the like, and at least one kind of them may be used.

Exemplified as the urethane resin are aromatic urethane resin obtained by polyaddition reacting isocyanato resin such as tolylene diisocyanate with a compound having a hydroxyl group, aliphatic urethane resin obtained by polyaddition reacting aliphatic isocyanato with a compound having a hydroxyl group, and the like, and at least one kind of them may be used.

Exemplified as the thermo-thermo (heat-heat) two-stage setting resin and the photo/thermo (light/heat) two-stage setting resin is "epoxy resin added with an unsaturated fatty acid portion" disclosed in Japanese Patent No. 3911690 and Japanese Patent Application Laid-Open Publication No. 2003-105061. The epoxy resin added with an unsaturated fatty acid portion is preferably raw epoxy resin having unsaturated fatty acid added to 20 to 80%, in particular, to 40 to 60% of total number of epoxy group in the epoxy resin. Specifically exemplified as the epoxy resin added with unsaturated fatty acid portion are novolac epoxy resins added with (meta) acryl acid [phenol novolac epoxy resin added with 20 to 80% of acrylic acid, cresol novolac epoxy resin added with 40 to 60% of acrylic acid, and the like], tris phenyl methane epoxy resin added with 40 to 60% of acrylic acid, novolac-type epoxy resin of bisphenol A added with 20 to 80% of methacrylic acid, dicyclopentadiene phenol epoxy resin added with 20 to 80% of methacrylic acid, phenol novolac epoxy resin added with 40 to 60% of crotonic acid, and the like, and at least one kind of them may be used.

The curable resin composition of the present invention is ordinarily blended with a curing agent. Specifically exemplified as the curing agent are latent curing agent [dicyan diamide, an imidazole series curing agents (imidazole, 2-methyl imidazole, 2-isopropyl imidazole, 2-n-heptadecyl imidazole, and the like), melamine derivative, salicylic acid hydrazide, adipic acid hydrazide, terephthalic acid dihydrazide, isophthalic acid dihydrazide, sebacic acid dihydrazide, eicosane diacid dihydrazide, 4,4'-diamino diphenyl sulfone, 3,3'-diamino diphenyl sulfone, 1,1-bis(4-hydroxy phenyl)cyclohexane, 4,4'-dihydroxybenzophenone, 4,4'-(1,3-phenylene diisopropylidene)bisphenol, 4,4'-sulfonyl diphenol, 4,4'-biphenol, N,N-dialkyl urea derivative, N,N-dialkylthio urea derivative and the like], a polybasic acid (anhydride) curing agent [(anhydrous)phthalic acid, (anhydrous)maleic acid, (anhydrous)trimellitic acid, (anhydrous)chlorendic acid, and the like], amine curing agents [ethylenediamine, trimethylene diamine, tetramethylenediamine, diethylene triamine, and the like], phenol curing agents [phenol novolak, cresol novolak, 2-(dimethylaminomethyl phenol), 2,4,6-tris(dimethylaminomethyl)phenol, and the like], imidazoline curing agents [2-methyl imidazoline, 2-phenyl imidazoline, and the like], amide curing agents [polyamide obtained by condensing dimer acid and polyamine, and the like], ester curing agents [activated carbonyl compounds such as carboxylic acid aryl and thioaryl ester, and the like], urea curing agents [butylated urea, butylated thiourea, and the like], phosphorus curing agents [ethylphosphine, phenylphosphine, dimethylphosphine, diphenylphosphine, and the like], onium salt curing agents [aryldiazonium salt, diaryliodonium salt, triarylsulfonium salt], active silica compound-aluminum complex [triphenyl silanol-aluminum complex, triphenyl methoxysilane-aluminum complex, and the like], anionic polymerization catalysts [trialkylaluminum, dialkyl zinc, phosphoric acid, and the like, butyllithium, sodium naphthalene, lithium alkoxide, and the like], cationic polymerization catalysts [boron trifluoride, complex boron trifluoride, tin tetrachloride, $AlCl_3$, trifluoroacetic acid, $BF_3(C_2H_5OH)_2$, metal halogen, amine, and the like], light cationic polymerization catalysts [triarylsulfonium salt, triaryl iodonium salt, bis(dodecylphenyl)hexafluoroantimonate, aryldiazonium salt, diaryliodonium salt, benzyl sulfonium salt, phosphonium salt, and the like], heat radical polymerization catalyst [organic peroxides such as ketone peroxide, hydro peroxide, peroxy ketal, diacyl peroxide, dialkyl peroxide, peroxydicarbonate, peroxy ester, and the like, azobisisobutyronitrile (AIBN) and the like], light radical polymerization catalysts [acetophenone derivative compounds such as 4-(2-hydroxyethoxy)phenyl (2-hydroxy-2-propyl)ketone, methoxy acetophenone, and the like, benzoin ether compounds such as benzoin ethyl ether, benzoin propyl ether, and the like, ketal derivative compounds such as benzyl dimethyl ketal and the like, ketone halide, and the like], and at least one kind of them may be used.

The curing agent is appropriately selected according to the curing types, the types of the curable resins, and the like. In, for example, the anionic polymerization type, epoxy resin is exemplified as the curable resin, and an imidazole curing agent, an amine curing agent, a polybasic acid (anhydride) curing agent, a phenol curing agent, and the like are exemplified as the curing agent. In a heat cationic polymerization type, epoxy resin and oxetane resin are exemplified as the curable resin, and a cationic polymerization catalyst and the like are exemplified as the curing agent. In a light cationic polymerization type, epoxy resin and oxetane resin are exemplified as the curable resin, and a light cationic polymerization catalyst and the like are exemplified as the curing agent. In a light radical polymerization type, acrylate resin and urethane resin are exemplified as the curable resin, and a light radical polymerization catalyst and the like are exemplified as the curing agent. In a heat radical polymerization type, acrylate resin and urethane resin are exemplified as the curable resin, and peroxide and the like are exemplified as the curing agent. Note that, in two-stage polymerization types, curing agents are used together according to respective polymerization types.

The curable resin composition of the present invention may be added with one or more kinds of a coloring agent, a viscosity adjusting agent, a thixotropy agent, antifoaming agents (polydimethylsiloxane, a denatured silicone type, a fluorine type, a polymer type, a surface-active agent, an emulsion type and the like), a leveling agent, a coupling agent, a photosensitizer, an organic filler, a mold lubricant, a surface treatment agent, a flame retardant, a plasticizer, an antibacterial agent, an antifungal agent, a stabilizing agent, an antioxidant, and a fluorescent substance, and the like in addition to the above-mentioned substances.

As the blended composition (weight %) of the curable resin composition of the present invention, 40 to 80 (wt %) (in particular, 50 to 65 (wt %)) of curable resin and 1 to 10 (wt %) (in particular, 2 to 6 (wt %)) of a curing agent are preferable.

When the curable resin is too small, since the content ratio of a filler is relatively increased, the average linear expansion coefficient of the cured product may be reduced, whereas when the curable resin is too large, the cured product may be swelled by the heat history of a post-process due to an excessively large average linear expansion coefficient.

Ordinarily, a cured product having the following preferable average linear expansion coefficient is provided from the preferable curable resin composition of the present invention prepared as described above. That is, the preferable average linear expansion coefficient (ppm/K) of the cured product is 50 or more, more preferably 65 to 100, and most preferably 70 to 80 in at least one direction at a temperature less than the Tg (glass transition point) thereof.

The reason why the average linear expansion coefficient of the cured product of the resin composition of the present invention is defined in at least one direction will be described. When the curable resin composition is employed for, for example, plugging a through hole of a core substrate, it suffices to look at the average linear expansion coefficient of the cured product of the resin composition only in the Z-axis direction of the core substrate, and control of average linear expansion coefficients in radial directions is not necessary. In other words, if a cured product of the curable resin composition has, in at least one direction, an average linear expansion coefficient which is equal to or higher than a predetermined value, no particular control is needed on the average linear expansion coefficients in other directions. In the case where a cured product of the curable resin composition has anisotropy in average linear expansion coefficient, a direction along which the average linear expansion coefficient satisfies the aforementioned conditions can be determined as the Z-axis direction. Those skilled in the art can readily perform such fitting based on the conditions under which the cured product has been obtained.

Meanwhile, whether or not the "average linear expansion coefficient in at least one direction" falls within a predetermined range can be determined in the following manner. Firstly, a through hole of a core substrate is plugged with the cured product, then the average linear expansion coefficient of the cured product in the axial direction (i.e., thickness direction) of the core substrate is determined and evaluated. If the obtained value falls within the predetermined range, the curable resin composition which has given the cured product is confirmed to be within the scope of the present invention. In a specific procedure, the average linear expansion coefficient in the Z-axis direction of the cured product plugging the through hole may be determined through thermomechanical analysis (TMA). Alternatively, a cured product having a shape similar to that of the hole-plugging cured product (e.g., a columnar cured product) is formed separately, and the average linear expansion coefficient in the Z-axis direction of the cured product is determined and evaluated.

Further, when the curable resin composition of the present invention is used to fill the holes of the core substrate, the preferable average linear expansion coefficient of the cured product is larger than the average linear expansion coefficient of the core substrate, preferably larger than it by 10 ppm/K or more, more preferably larger than it by about 25 to 40 ppm/K, and most preferably larger than it by about 25 to 30 ppm/K in the Z-axis direction at the temperature less than the Tg. Accordingly, it is preferable to adjust and select the average particle diameter and the content of the inorganic filler according to the type of the core substrate for which the inorganic filler is used.

The curable resin composition of the present invention ordinarily has a viscosity (Pa·s, 25° C.) of 10 to 50, and preferably 20 to 40.

Although the curable resin composition of the present invention is appropriately cured selectively depending on a curing type and the like, it is cured by being, for example, heated (100 to 200° C. and the like) and/or radiated with light (wavelength: 320 to 400 nm, and the like).

In the core substrate of the present invention, at least one hole is filled with a cured product of the curable resin composition of the present invention. A halogen-free resin substrate, which has a small load on an environment, is preferable as the core substrate. Specifically exemplified as such core substrate are an EP resin substrate, a PI (polyimide) resin substrate, a BT (bismaleimide-triazine) resin substrate, a PPE (polyphenylene ether) resin substrate, and substrates [a glass-BT substrate, a high Tg glass-EP substrate (FR-4, FR-5, and the like)] which are composed of these resins and glass fiber (a glass woven fabric and a glass nonwoven fabric) or organic fiber (polyamide fiber and the like). The core substrate is preferably an EP resin substrate.

The core substrate has at least one hole. Although a through hole, a non-through hole, a recess, and the like (specifically, a through hole, a via hole, a part hole, a recess between circuits, and the like) are exemplified as the hole, it is typically the through hole (hole diameter: 0.05 to 0.3 μm and the like). The hole portion (including a wall surface) may have a plated surface (4). Further, the end surface of the filled hole portion may be subjected to a planar process or may be covered with a conductor. For example, the end surface of a filled through hole may be lid-plated (5) (plating thickness: 10 to 20 μm and the like).

The core substrate may be provided with a conductor layer (a circuit and the like) on the surface or in the inside thereof. Further, the core substrate may be partly or entirely covered with a conductor substance. It may be a laminated sheet (copper-laminated sheet and the like) one surface or both the surfaces of which, for example, are covered with a conductor.

The core substrate may be composed of a single layer or a multilayer and may be a composite substrate on which at least two core substrates are directly laminated or laminated through other layer.

The printed wiring board of the present invention has at least one core substrate of the present invention in the structure thereof.

The printed wiring board may be composed of the single layer or the multilayer. The multilayer printed wiring board includes a multilayer printed wiring board which is manufactured by a build-up method, a simultaneous hot press method, and all the other multilayer printed wiring board manufacturing methods.

The printed wiring board may have at least one different hole portion in addition to the hole portion of the core substrate. A hole portion, which is similar to the hole portion exemplified in the core substrate, is exemplified as the hole portion.

A build-up printed wiring board will be described in detail as a mode of the printed wiring board of the present invention. The build-up printed wiring board of the mode has a build-up layer (7) on one surface or on both the surfaces of the core substrate of the present invention.

Exemplified as the core substrate is a core substrate having a filled hole portion (through hole and the like) the end surface of which is lid-plated. The thickness of the core substrate is ordinarily 0.1 to 5.0 mm, preferably 0.2 to 1.6 mm, and most preferably 0.4 to 1.0 mm.

At least one layer, typically 2 to 10 layers, and most typically 3 to 8 layers, for example, are formed on one surface as the build-up layer (7). The thickness of the build-up layer is ordinarily 20 to 100 μm, preferably 30 to 80 μm, and most preferably 40 to 60 μm per layer. For example, a film-like epoxy resin composition in a B stage state, a prepreg, and the like are preferable as build-up resin. The build-up layer (7) may be provided with conductor layers (circuits and the like) (6). The conductor layers may be electrically connected to each other.

The build-up printed wiring board preferably has a via-on-via structure so that it has a small connection space and a large wiring region. Especially, the advantage of the present invention can be very prominently achieved in a stacked via structure. The via-on-via structure may be located just above, for example, a lid-plated core substrate.

Although a via may be any of a filled via and a conformal via, the filled via is suitable in the via-on-via structure. The filled via may have a flat end surface and further a conductor layer (circuit and the like) on the end surface (10). A via diameter is, for example, 30 to 100 μm. Note that a via fill plating may be executed by nonelectrolytic plating and/or electrolytic plating and the like using a growth inhibitor and/or a growth promotant when necessary.

The build-up printed wiring board having the stacked via structure of the mode has an excellent crack resistant property and thus an excellent connection reliability. When, for example, 100 daisy chains are subjected to a cold/heat cycle test (−65 to +150° C.), occurrence of cracks can be prevented even if the cold/heat cycle is executed 1000 times or more with a result that the variation of a conductor resistance can be suppressed within ±5%.

EXAMPLES

<Preparation of Curable Resin Composition (through Hole-Plugging Paste>

Examples 1 and 2 and Comparative Examples 1 to 4

After respective blend components were preliminarily blended and dispersed according to a blend composition shown in Table 1, they were mixed using a three-roll mill, and respective through hole-plugging pastes (examples 1 and 2 and comparative examples 1 to 4) were prepared.

<Measurement of Tg and Average Linear Expansion Coefficient of Cured Products>

Each of the through-hole-plugging pastes (produced in Examples 1 and 2, and Comparative Examples 1 to 4) was poured into a mold, and in a hot-air circulating dry oven, preliminarily cured at 110° C. for 60 minutes and completely cured at 150° C. for 30 minutes, to thereby form a cured product having isotropy in average linear expansion coefficient. The cured product was worked by means of a machine such as a lathe, to thereby produce disk-shape test samples (φ 8 mm×1.5 mm). The Tg and average linear expansion coefficient of each test sample were determined through TMA.

Specifically, a test sample was placed on a quartz base, and a probe was brought into contact with the sample at a contact load of 0.4 kgf. The sample was heated at an elevation rate of 10° C./min within a range of −60° C. to 300° C. During heating, the displacement (0: start of heating) of the probe and the temperature were measured every 0.1 seconds. The thus-obtained data on the temperature and displacement were plotted, to thereby obtain a curve. The inflection point of the curve, serving as Tg, was obtained by a tangent of the curve.

The average linear expansion coefficient was calculated from the data (temperature and displacement) of two points on the curve, one measured at a temperature lower than Tg and the other higher than Tg. Table 1 shows the results.

TABLE 1

| | | Example | | Comparative Example | | | |
|---|---|---|---|---|---|---|---|
| | | 1 | 2 | 1 | 2 | 3 | 4 |
| Blended Composition (wt %) | barium sulfate (average particle diameter 0.03 μm) | 38.83 | — | — | — | — | — |
| | barium sulfate (average particle diameter 0.6 μm) | — | 38.83 | — | — | — | — |
| | spherical silica (average particle diameter 0.5 μm) | — | — | 10.20 | — | — | — |
| | spherical silica (average particle diameter 1 μm) | — | — | — | 16.08 | — | 58.74 |
| | spherical silica (average particle diameter 3 μm) | — | — | — | 48.23 | — | — |
| | spherical silica (average particle diameter 6 μm) | — | — | 25.51 | — | — | — |
| | calciumcarbonate (averageparticle diameter 3 μm) | — | — | — | — | 72.99 | — |
| | liquid bisphenol A epoxy resin | 48.54 | 48.54 | 51.02 | — | — | 29.37 |
| | phenol novolak epoxy resin | — | — | — | 6.43 | — | — |
| | glycidyl amine epoxy resin | — | — | — | 25.72 | 24.33 | — |
| | phenyl glycidyl ether | 7.28 | 7.28 | 7.65 | — | — | 8.81 |
| | imidazole curing agent | 4.85 | 4.85 | 5.10 | 3.22 | 2.43 | 2.94 |
| | antifoaming agent | remaining amount | remaining amount | remaining amount | remaining amount | remaining amount | remaining amount |

TABLE 1-continued

|  | Example | | Comparative Example | | | |
|---|---|---|---|---|---|---|
|  | 1 | 2 | 1 | 2 | 3 | 4 |
| Tg (° C.) of cured product | 120 | 120 | 120 | 160 | 160 | 110 |
| Average linear expansion coefficient (ppm/K) of cured product | 65 | 50 | 40 | 24 | 30 | 42 |

<Manufacture of Build-Up Printed Wiring Board>

Manufactured Examples 1 and 2 and Comparative Manufactured Examples 1 to 4

First, the plated through holes (hole diameter: 150 μm) of epoxy resin substrates (thickness: 0.4 mm, "ELC-4765GF" made by Sumitomo Bakelite Co., Ltd., coefficient of thermal expansion in a Z-axis direction: 40 ppm/K) were filled with through hole-plugging pastes (examples 1 and 2 and comparative examples 1 to 4) by a screen print method. The pastes were cured by heating the substrates (150° C., 60 minutes). The cured resin protruding from the front and back surfaces of the substrates were polished and removed using a ceramic buff so that both the surfaces of the substrates were made flat. Both the surfaces of the substrates were entirely copper-plated, further unnecessary copper plating was removed by etching, and a pattern [through hole lid-plating (plating thickness: 20 μm), and a circuit (plating thickness: 20 μm) and the like] was formed on both the surfaces of the substrates.

An epoxy resin insulation film (thickness: 65 μm) was pressed on both the surfaces of the substrates. Vias (via diameter: 80 μm) were formed on the lid-plating by a laser hole making machine. Next, via fill plating was executed by executing cupper-plating on the entire surfaces, and further unnecessary copper plating was removed by etching. With the above steps, a pattern [first stage filled via and a circuit (plating thickness: 15 μm) and the like] was formed on both the surfaces of the substrates.

Figure 1:
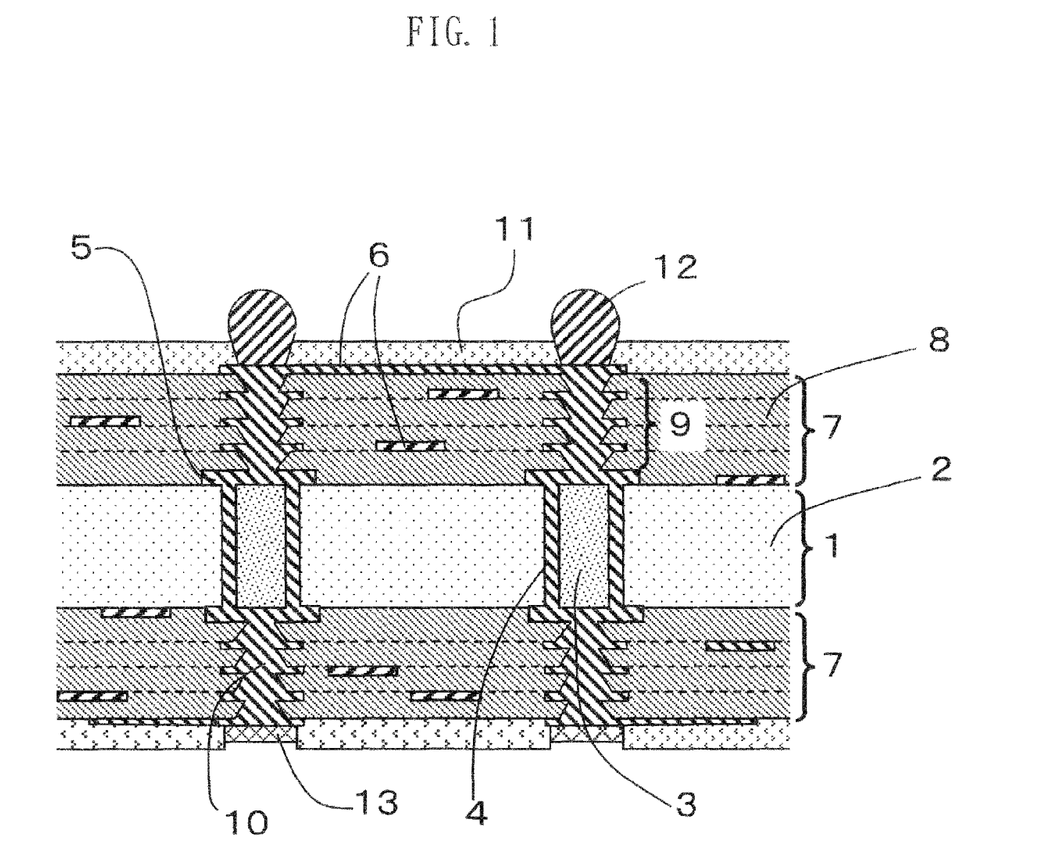
FIG. 1 is a sectional view of a build-up printed wiring board (respective manufactured examples 1 and 2 as well as comparative manufactured examples 1 to 4) having a four-stage stacked via structure on both surfaces.

Thereafter, four build-up layers (7) were formed on the front and back surfaces of a core substrate (1) by repeating the pattern forming process. Thereafter, the front and back surfaces of the core substrate were covered with a solder resist film (11), and a bump (12) was formed on a pad portion (13) by nickel/gold plating and soldering. As described above, the build-up printed wiring boards having the stacked via structure (manufactured examples 1 and 2 and comparative manufactured examples 1 to 4) were manufactured (FIG. 1).

The build-up printed wiring boards have a total thickness of 0.95 mm. Further, the build-up printed wiring boards have such a structure that an outermost layer on one side is connected to an outermost layer on an opposite side by 46 daisy chains in total through a through hole.

<Characteristics Evaluation Test of Build-Up Printed Wiring Board>

The connection reliability of the build-up printed wiring boards (manufactured examples 1 and 2 and comparative manufactured examples 1 to 4) was evaluated as shown below. Note that the number of samples of each of the build-up printed wiring boards was 25 pieces.

First, the initial conductor resistance values of the build-up printed wiring boards were measured. Next, after a precon (JEDEC Level 3+260° C. Max reflow×three times) was executed, the build-up printed wiring boards were subjected to a cold/heat cycle test (−65° C./5 minutes to +150° C./5 minutes). Then, respective conductor resistance values were measured each 200 cycles up to 1000 cycles. When conductor resistance change ratio (=conductor resistance variation amount/initial conductor resistance value×100) reached ±5%, "defect" was determined. Table 2 shows the number of samples which are determined defective and the conductor resistance change ratio (average value).

TABLE 2

|  |  | Manufactured example | | Comparative manufactured example | | | |
|---|---|---|---|---|---|---|---|
|  |  | 1 | 2 | 1 | 2 | 3 | 4 |
| through hole-plugging ink used | | Example 1 | Example 2 | Comparative Example 1 | Comparative Example 2 | Comparative Example 3 | Comparative Example 4 |
| Number of defects (pieces/25 pieces) | after precon | 0 | 0 | 0 | 0 | 0 | 0 |
| | after cold/heat cycle is executed 200 times | 0 | 0 | 0 | 0 | 0 | 0 |
| | after cold/heat cycle is executed 400 times | 0 | 0 | 0 | 0 | 0 | 0 |
| | after cold/heat cycle is executed 600 times | 0 | 0 | 0 | 2 | 0 | 0 |
| | after cold/heat cycle is executed 800 times | 0 | 0 | 1 | 21 | 5 | 4 |
| | after cold/heat cycle is executed 1000 times | 0 | 0 | 13 | 23 | 24 | 16 |
| conductor resistance change | after precon | 0.02 | −0.01 | 0.01 | 0.28 | 0.31 | 0.17 |
| | after cold/heat cycle is executed | 0.21 | 0.69 | 0.93 | 0.55 | 1.40 | 0.89 |

TABLE 2-continued

|  |  | Manufactured example | | Comparative manufactured example | | | |
| --- | --- | --- | --- | --- | --- | --- | --- |
|  |  | 1 | 2 | 1 | 2 | 3 | 4 |
| ratio (%) | 200 times after cold/heat cycle is executed | 0.87 | 1.35 | 1.77 | 2.02 | 1.18 | 1.68 |
|  | 400 times after cold/heat cycle is executed | 1.56 | 2.27 | 2.92 | 3.91 | 3.63 | 3.14 |
|  | 600 times after cold/heat cycle is executed | 2.14 | 2.54 | 4.18 | 17.82 | 4.51 | 4.88 |
|  | 800 times after cold/heat cycle is executed | 2.65 | 2.71 | 5.24 | 68.40 | 8.03 | 6.43 |
|  | 1000 times |  |  |  |  |  |  |

As apparent from Table 2, the number of defective boards in the build-up printed wiring boards (manufactured examples 1 and 2) according to the present invention is 0 in the 25 samples even at the time the cold/heat cycle has been finished 1000 times and the conductor resistance change ratio is less than 3%, from which it can be found that very stable conduction can be obtained.

On the other hand, in the conventional build-up printed wiring boards (comparative manufactured examples 1 to 4), the number of defective boards at the time the cold/heat cycle has been finished 1000 times is 13 to 24 in the 25 samples and the conductor resistance change ratio exceeds 4% at the time the cold/heat cycle has been finished 600 to 800 times, from which it can be found that conduction is very unstable.

[Operation and its Mechanism]

In the build-up printed wiring board having the stacked via structure, when the core substrate is the halogen-free resin substrate and the cured product with which the through hole of the core substrate is filled has a large coefficient of thermal expansion, the build-up printed wiring board is excellent in the crack resistant property and thus excellent in the connection reliability. It is considered that this is because of the following reasons (refer to FIG. 3).

Figure 3:
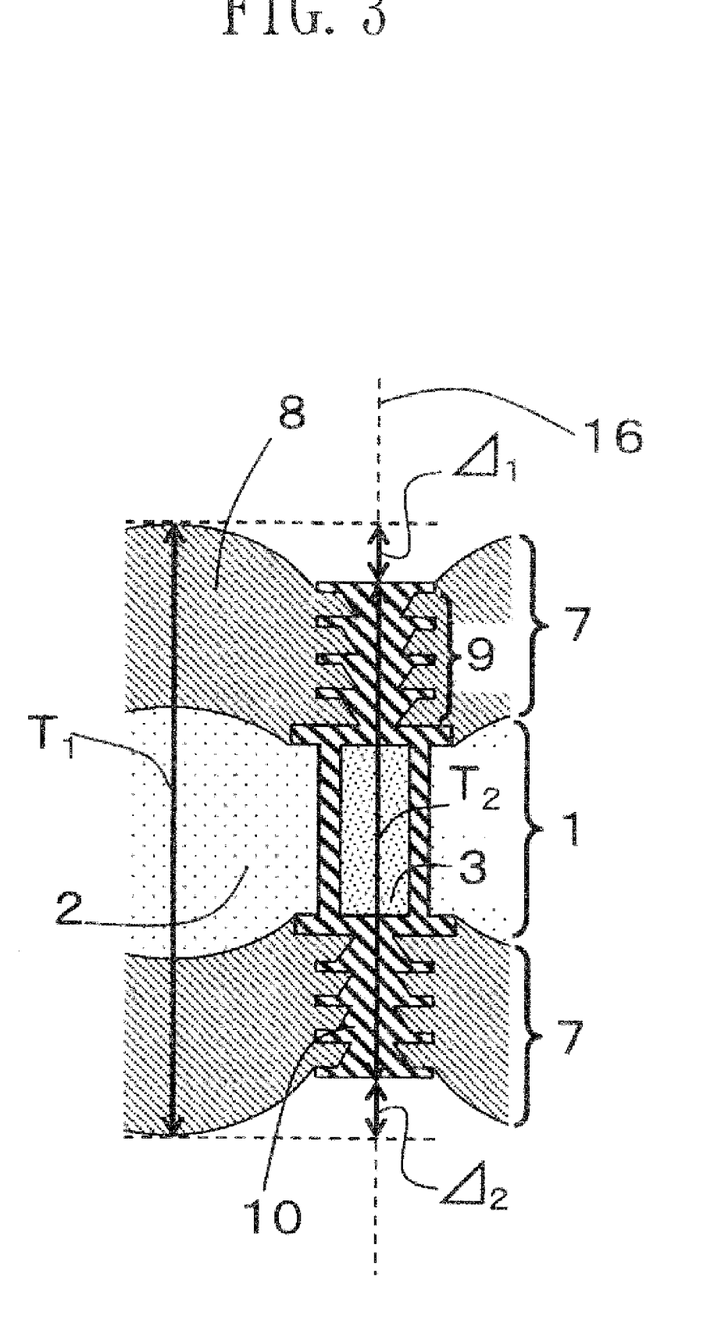
FIG. 3 is a sectional view of the vicinity of a through hole axial line portion after the build-up printed wiring board is heated.

When the build-up printed wiring board is heated, it is thermally expanded ordinarily. At the time, it is considered that a crack occurs when the difference $\Delta$ ($=\Delta_1+\Delta_2$) between the thickness $T_1$ of a resin layer and the thickness $T_2$ of a through hole axial line portion is very large after the thermal expansion. $\Delta_1$ means a thickness difference of one side and $\Delta_2$ means a thickness difference of the opposite side.

Incidentally, the difference $\Delta$ is caused by the difference between the amount of expansion of the resin layer and the amount of expansion of the through hole axial line portion in the Z-axis direction (16). That is, $\Delta$=(amount of expansion of resin layer)−(amount of expansion of through hole axial line portion).

In contrast, in the Z-axis direction, (amount of expansion of resin layer)=(amount of expansion of build-up resin (8))+(amount of expansion of core substrate resin (2)).

Further, in the Z-axis direction, (amount of expansion of through hole axial line portion)=(amount of expansion of via-filled plating (10))+(amount of expansion of through-hole-plugging cured product (3)).

Incidentally, the thermal expansion of resin is generally larger than that of metal. Accordingly, any of the amount of expansion of the build-up resin (8) and the amount of expansion of the core substrate resin (2) is larger than that of the via-filled plating (10). In particular, since suppression of the thermal expansion of the halogen-free resin is more difficult than that of the thermal expansion of halogen-containing resin, when the core substrate (1) is the halogen-free resin substrate, the core substrate resin 2 has a much larger amount of expansion.

From what has been described above, the amount of expansion of the through-hole-plugging cured product 3, more particularly, the linear expansion coefficient thereof must be increased from the above expressions in order to reduce the difference $\Delta$. However, a conventional filling resin ink is designed and prepared to rather reduce the coefficient of thermal expansion of a cured product to prevent occurrence of a crack.

Accordingly, when a build-up printed wiring board is manufactured using the conventional filling resin ink, the difference $\Delta$ is increased when the core substrate 1 is, for example, the halogen-free resin substrate. Further, since the difference $\Delta$ is increased in proportion to the thickness of a build-up layer, more particularly, to the number of the build-up layers, when the build-up layer has three layers or more, when, for example, it employs a stacked via structure, the difference $\Delta$ exceeds the withstand limit value of a crack with a result that a crack occurs.

What is claimed is:

1. A curable resin composition containing an inorganic filler, wherein:
    an average particle diameter of the inorganic filler is 0.1 μm or less and a content of the inorganic filler is 50 wt % or less;
    the resin composition fills a hole of a build-up printed wiring board having a via-on-via structure; and
    the resin composition provides a cured product having an average linear expansion coefficient of 50 ppm/K or more in at least one direction at a temperature less than the glass transition temperature (Tg).

2. The curable resin composition according to claim 1, wherein the content of the inorganic filler is 10 to 50 wt %.

3. The curable resin composition according to claim 1, wherein a cured product having an average linear expansion coefficient of 65 to 100 ppm/K in at least one direction at a temperature less than the Tg is provided.

4. The curable resin composition according to claim 1, wherein the curable resin composition is used to fill a hole of a core substrate.

5. The curable resin composition according to claim 4, wherein the core substrate is a halogen-free resin substrate.

6. The curable resin composition according to claim 1, wherein the build-up printed wiring board has a stacked via structure.

7. The curable resin composition according to claim 4, wherein the average linear expansion coefficient at a temperature less than the Tg of the cured product is larger than the average linear expansion coefficient of the core substrate by 25 ppm/K or more in a Z-axis direction of the core substrate.

8. The curable resin composition according to claim 1, wherein the curable resin composition contains 40 to 80 wt % of curable resin and 1 to 10 wt % of a curing agent.

9. The curable resin composition according to claim 1, wherein the curable resin is epoxy resin.

10. A core substrate used to manufacture a build-up printed wiring board having a via-on-via structure, wherein at least one hole portion is filled with the cured product of the curable resin composition according to claim 1.

11. The core substrate according to claim 10, wherein the core substrate is a halogen-free resin substrate.

12. The core substrate according to claim 10, wherein the build-up printed wiring board has a stacked via structure.

13. A build-up printed wiring board comprising the core substrate according to claim 10, wherein the build-up printed wiring board has a via-on-via structure.

14. The build-up printed wiring board according to claim 13, wherein the build-up printed wiring board has a stacked via structure.

* * * * *